(12) United States Patent
Aoki

(10) Patent No.: US 10,978,004 B2
(45) Date of Patent: Apr. 13, 2021

(54) DATA DRIVER, DISPLAY DEVICE, AND ELECTRONIC APPARATUS

(71) Applicant: SONY CORPORATION, Tokyo (JP)

(72) Inventor: Takeshi Aoki, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 15/523,400

(22) PCT Filed: Sep. 3, 2015

(86) PCT No.: PCT/JP2015/075110
§ 371 (c)(1),
(2) Date: Apr. 30, 2017

(87) PCT Pub. No.: WO2016/080052
PCT Pub. Date: May 26, 2016

(65) Prior Publication Data
US 2017/0316742 A1    Nov. 2, 2017

(30) Foreign Application Priority Data
Nov. 18, 2014    (JP) ............................. JP2014-233626

(51) Int. Cl.
*G09G 3/3275* (2016.01)
*G09G 3/3233* (2016.01)
(Continued)

(52) U.S. Cl.
CPC ......... *G09G 3/3275* (2013.01); *G09G 3/2003* (2013.01); *G09G 3/2074* (2013.01);
(Continued)

(58) Field of Classification Search
CPC .. G09G 3/3275; G09G 3/3233; G09G 3/2003; G09G 3/2074; G09G 2310/0235;
(Continued)

(56) References Cited

U.S. PATENT DOCUMENTS

| 8,154,267 | B2* | 4/2012 | Noda | .............. H02M 3/156 323/284 |
| 9,384,706 | B2* | 7/2016 | Choi | .............. G09G 3/3696 |

(Continued)

FOREIGN PATENT DOCUMENTS

| JP | 2001-255857 A | 9/2001 |
| JP | 2006-018087 A | 1/2006 |

(Continued)

*Primary Examiner* — Jeff Piziali
(74) *Attorney, Agent, or Firm* — Chip Law Group

(57) ABSTRACT

Provided is a data driver configured to drive a display unit that includes a two-dimensional matrix of pixels, the data driver including: a resistance circuit to which a plurality of reference voltages with different values are applied, the resistance circuit including a plurality of output nodes configured to output the reference voltages and voltages obtained by dividing the reference voltages; a selector unit configured to select one of the plurality of output nodes in accordance with a value of an input gradation signal, and cause a voltage corresponding to the value of the gradation signal to be output; and a phase difference control unit configured to perform control to delay an output node selection operation by the selector unit in the case where an input gradation signal is included in a predetermined high tonal range or a predetermined low tonal range.

9 Claims, 15 Drawing Sheets

(51) Int. Cl.
*G09G 3/20* (2006.01)
*H01L 27/32* (2006.01)

(52) U.S. Cl.
CPC ... *G09G 3/3233* (2013.01); *G09G 2310/0235* (2013.01); *G09G 2320/0233* (2013.01); *G09G 2330/06* (2013.01); *H01L 27/3244* (2013.01)

(58) Field of Classification Search
CPC ........ G09G 2320/0233; G09G 2330/06; H01L 27/3244
See application file for complete search history.

(56) References Cited

U.S. PATENT DOCUMENTS

| | | | | |
|---|---|---|---|---|
| 9,424,795 | B2* | 8/2016 | Saitoh | G09G 3/3648 |
| 2003/0011553 | A1* | 1/2003 | Ozaki | G09G 3/3688 |
| | | | | 345/89 |
| 2005/0225563 | A1* | 10/2005 | Brown Elliott | G09G 5/02 |
| | | | | 345/604 |
| 2006/0001627 | A1* | 1/2006 | Murata | G09G 3/2011 |
| | | | | 345/89 |
| 2007/0115274 | A1* | 5/2007 | Shih | G09G 3/3655 |
| | | | | 345/211 |
| 2011/0032236 | A1* | 2/2011 | Suzuki | G01D 3/08 |
| | | | | 345/211 |
| 2011/0193844 | A1* | 8/2011 | Lee | G09G 3/3648 |
| | | | | 345/211 |
| 2011/0221762 | A1* | 9/2011 | Cheng | G09G 3/3648 |
| | | | | 345/611 |
| 2015/0170596 | A1* | 6/2015 | Choi | G09G 3/3696 |
| | | | | 345/212 |

FOREIGN PATENT DOCUMENTS

| | | |
|---|---|---|
| JP | 2008-065244 A | 3/2008 |
| JP | 2009-251524 A | 10/2009 |

* cited by examiner

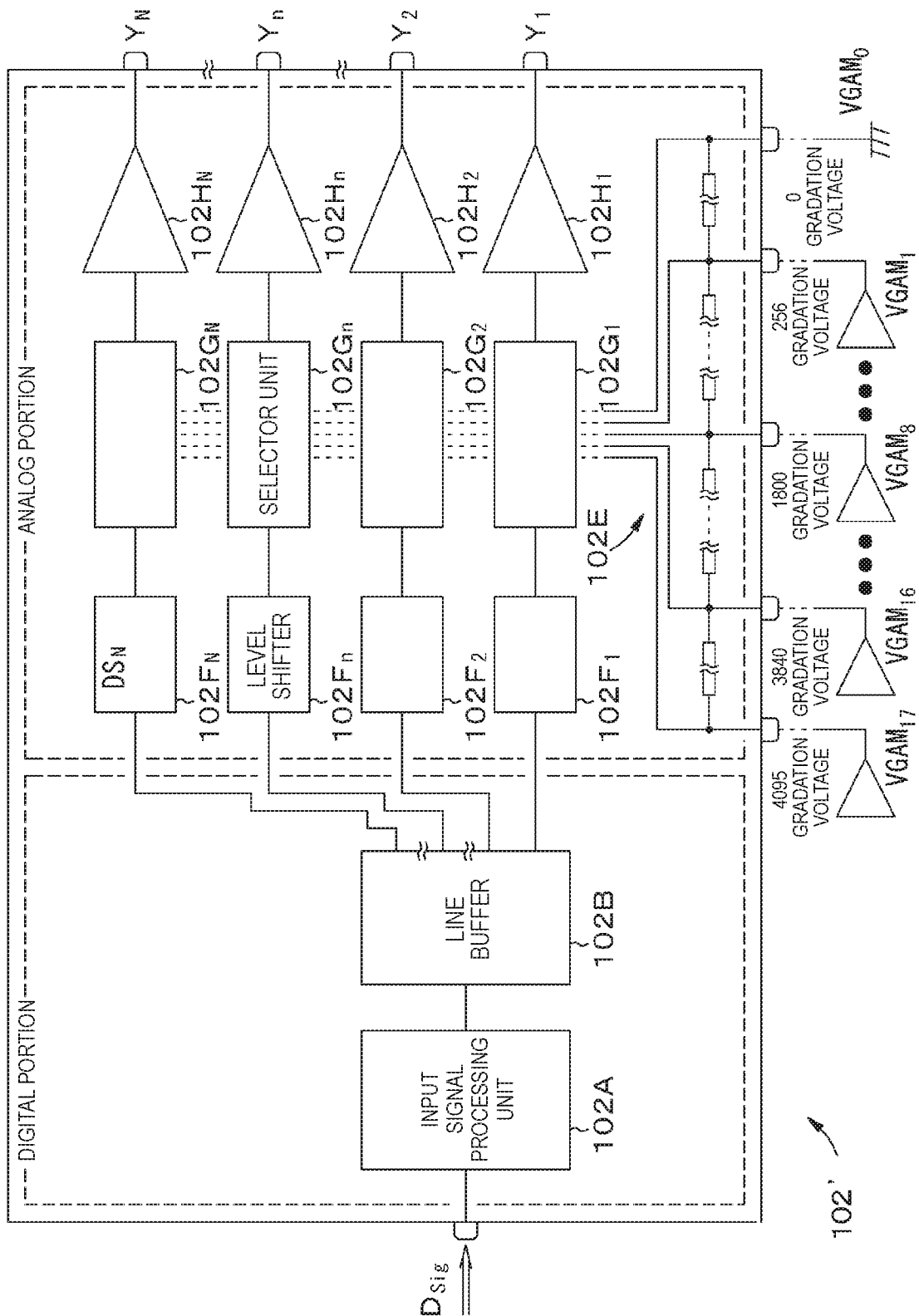

GRADATION (SAME FOR ALL OF R, G, AND B)

FIG. 9

| GRADATION VALUE | DELAY AMOUNT IN DRIVING FOR RED (PHASE DIFFERENCE) UNIT : nS | DELAY AMOUNT IN DRIVING FOR GREEN (PHASE DIFFERENCE) UNIT : nS | DELAY AMOUNT IN DRIVING FOR BLUE (PHASE DIFFERENCE) UNIT : nS |
|---|---|---|---|
| 4095 | 0 | 100 | 0 |
| 4094 | 0 | 100 | 0 |
| 4093 | 0 | 100 | 0 |
| ⋮ | ⋮ | ⋮ | ⋮ |
| 3073 | 0 | 20 | 0 |
| 3072 | 0 | 20 | 0 |
| 3071 | 0 | 20 | 0 |
| ⋮ | ⋮ | ⋮ | ⋮ |
| 2048 | 0 | 0 | 0 |
| 2047 | 0 | 0 | 0 |
| 2046 | 0 | 0 | 0 |
| ⋮ | ⋮ | ⋮ | ⋮ |
| 1025 | 0 | 20 | 0 |
| 1024 | 0 | 20 | 0 |
| 1023 | 0 | 20 | 0 |
| ⋮ | ⋮ | ⋮ | ⋮ |
| 2 | 0 | 100 | 0 |
| 1 | 0 | 100 | 0 |
| 0 | 0 | 100 | 0 |

GRADATION (SAME FOR ALL OF R, G, AND B)

FIG. 11

| GRADATION VALUE | DELAY AMOUNT IN DRIVING FOR RED (PHASE DIFFERENCE) UNIT : nS | DELAY AMOUNT IN DRIVING FOR GREEN (PHASE DIFFERENCE) UNIT : nS | DELAY AMOUNT IN DRIVING FOR BLUE (PHASE DIFFERENCE) UNIT : nS |
|---|---|---|---|
| 4095 | 100 | 100 | 0 |
| 4094 | 100 | 100 | 0 |
| 4093 | 100 | 100 | 0 |
| ⋮ | ⋮ | ⋮ | ⋮ |
| 3073 | 20 | 20 | 0 |
| 3072 | 20 | 20 | 0 |
| 3071 | 20 | 20 | 0 |
| ⋮ | ⋮ | ⋮ | ⋮ |
| 2048 | 0 | 0 | 0 |
| 2047 | 0 | 0 | 0 |
| 2046 | 0 | 0 | 0 |
| ⋮ | ⋮ | ⋮ | ⋮ |
| 1025 | 20 | 20 | 0 |
| 1024 | 20 | 20 | 0 |
| 1023 | 20 | 20 | 0 |
| ⋮ | ⋮ | ⋮ | ⋮ |
| 2 | 100 | 100 | 0 |
| 1 | 100 | 100 | 0 |
| 0 | 100 | 100 | 0 |

DATA DRIVER, DISPLAY DEVICE, AND ELECTRONIC APPARATUS

CROSS REFERENCE TO RELATED APPLICATIONS

This application is a U.S. National Phase of International Patent Application No. PCT/JP2015/075110 filed on Sep. 3, 2015, which claims priority benefit of Japanese Patent Application No. JP 2014-233626 filed in the Japan Patent Office on Nov. 18, 2014. Each of the above-referenced applications is hereby incorporated herein by reference in its entirety.

TECHNICAL FIELD

The present disclosure relates to a data driver, a display device including the data driver, and an electronic apparatus including the display device.

BACKGROUND ART

In a display device including a display unit such as an electroluminescent display panel, a data driver that generates voltages corresponding to gradation of an image is used to display images. A known data driver has a configuration in which a voltage corresponding to a value of a gradation signal is selected as appropriate to be output, from among a plurality of reference voltages and voltages obtained by dividing the reference voltages by using a resistance circuit configured with ladder resistors (gamma resistors) or the like.

Higher-definition display panels and the like require high-speed operation of data drivers. However, high-speed operation increases unnecessary radiation (electro-magnetic interference (EMI)). An increase in EMI causes malfunction of electronic circuits, and therefore needs to be suppressed. For example, JP 2009-251524A (Patent Literature 1) describes that, in a plurality of source drivers constituting a data driver, operation timing is intentionally shifted for each source driver to cause interference of radiation noise that accompanies the operation of the source drivers.

CITATION LIST

Patent Literature

Patent Literature 1: JP 2009-251524A

DISCLOSURE OF INVENTION

Technical Problem

In a configuration in which operation timing is intentionally shifted for each source driver, as in Patent Literature 1 described above, a phenomenon may occur in which periodic light and dark stripes in correspondence with the source drivers occur in an image displayed on a display unit. Such light and dark stripes cause a reduction in image quality.

Accordingly, an object of the present disclosure is to provide a data driver that is capable of suppressing EMI and does not bring about noticeable light and dark stripes causing a reduction in image quality, a display device including the data driver, and an electronic apparatus including the display device.

Solution to Problem

According to a first aspect of the present disclosure in order to achieve the above-mentioned object, there is provided a data driver configured to be used for driving a display unit that includes pixels arranged in a two-dimensional matrix, the data driver including: a resistance circuit to which a plurality of reference voltages with different values are applied, the resistance circuit including a plurality of output nodes configured to output the reference voltages and voltages obtained by dividing the reference voltages; a selector unit configured to select one of the plurality of output nodes in accordance with a value of an input gradation signal, and cause a voltage corresponding to the value of the gradation signal to be output; and a phase difference control unit configured to perform control to delay an output node selection operation by the selector unit in the case where an input gradation signal is included in a predetermined high tonal range or a predetermined low tonal range.

According to the first aspect of the present disclosure in order to achieve the above-mentioned object, there is provided a display device including: a display unit that includes pixels arranged in a two-dimensional matrix; and a data driver configured to be used for driving the display unit. The data driver includes a resistance circuit to which a plurality of reference voltages with different values are applied, the resistance circuit including a plurality of output nodes configured to output the reference voltages and voltages obtained by dividing the reference voltages, a selector unit configured to select one of the plurality of output nodes in accordance with a value of an input gradation signal, and cause a voltage corresponding to the value of the gradation signal to be output, and a phase difference control unit configured to perform control to delay an output node selection operation by the selector unit in the case where an input gradation signal is included in a predetermined high tonal range or a predetermined low tonal range.

According to the first aspect of the present disclosure in order to achieve the above-mentioned object, there is provided an electronic apparatus including a display device, the display device including a display unit that includes pixels arranged in a two-dimensional matrix, and a data driver configured to be used for driving the display unit. The data driver includes a resistance circuit to which a plurality of reference voltages with different values are applied, the resistance circuit including a plurality of output nodes configured to output the reference voltages and voltages obtained by dividing the reference voltages, a selector unit configured to select one of the plurality of output nodes in accordance with a value of an input gradation signal, and cause a voltage corresponding to the value of the gradation signal to be output, and a phase difference control unit configured to perform control to delay an output node selection operation by the selector unit in the case where an input gradation signal is included in a predetermined high tonal range or a predetermined low tonal range.

Advantageous Effects of Invention

According to the data driver according to the first aspect of the present disclosure, control is performed to delay the output node selection operation by the selector unit in the case where the input gradation signal is included in the predetermined high tonal range or the predetermined low tonal range. This distributes timings at which voltages and currents output by the data driver change, which suppresses EMI. Moreover, since the control is based on a value of the input gradation signal, noticeable periodic light and dark stripes do not occur. The effects described in the present

BRIEF DESCRIPTION OF DRAWINGS

FIG. 5 is a schematic circuit diagram for describing a configuration of a data driver serving as a reference example.

FIG. 6B is a schematic circuit diagram for describing an operation when a voltage of an output node is selected to be output.

FIG. 7B is a schematic graph for describing the relation between an output voltage output from an output amplifier and an allowance in slew rate.

FIG. 8B is a schematic diagram for describing an example when selection of an output node by a selector unit is controlled in driving of a subpixel that displays green, which has the highest luminosity among red, green, and blue.

FIG. 9 is a table for describing a configuration of a table, for example.

FIG. 10B is a schematic diagram for describing an example when selection of an output node by a selector unit is controlled in driving of a subpixel that displays green, which has the highest luminosity among red, green, and blue, and a subpixel that displays red, which has the second highest luminosity.

FIG. 11 is a table for describing a configuration of a table, for example.

FIGS. 13A and 13B FIG. 13A is a schematic graph for describing driving accompanied by offset writing operation. FIG. 13B is a schematic graph for describing driving not accompanied by offset writing operation.

MODE(S) FOR CARRYING OUT THE INVENTION

Figure 1:
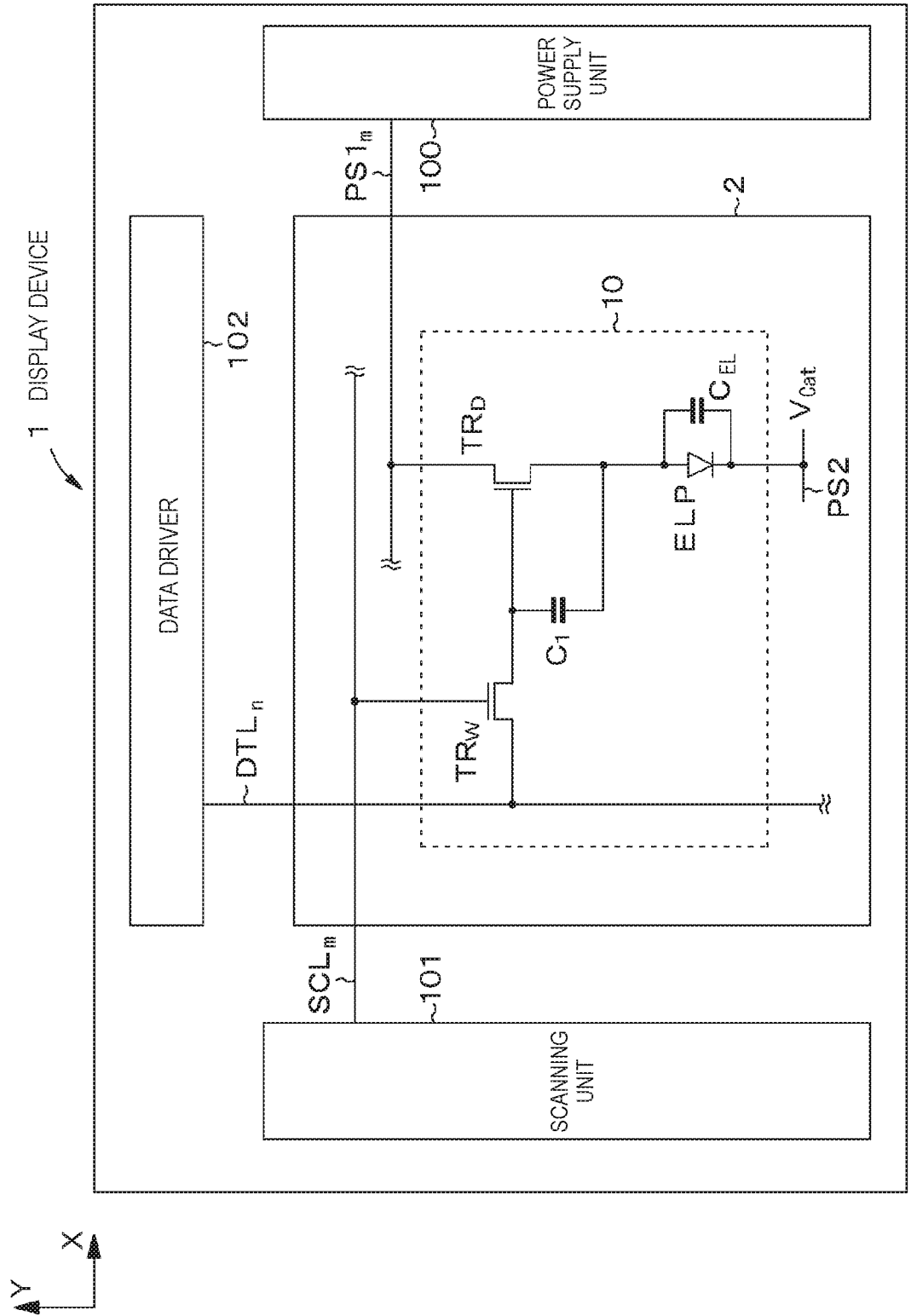
FIG. 1 is a conceptual diagram of a display device according to a first embodiment.

The present disclosure is described below on the basis of an embodiment with reference to the drawings. The present disclosure is not limited to the embodiment, and the various numerical values and materials in the embodiment are examples. In the following description, the same elements or elements that have the same function are denoted with the same reference numerals, and repeated explanation of these elements is omitted. The description is given in the following order.
1. Overall description of data driver according to present disclosure, display device including data driver, and electronic apparatus including display device
2. First embodiment and others

[Overall Description of Data Driver According to Present Disclosure, Display Device Including Data Driver, and Electronic Apparatus Including Display Device]

In the data driver according to the first aspect of the present disclosure, a data driver used for the display device according to the first aspect of the present disclosure, and a data driver used for the electronic apparatus according to the first aspect of the present disclosure (hereinafter, these are simply called data drivers according to the first aspect of the present disclosure in some cases), a phase difference control unit performs control to delay an output node selection operation by a selector unit in the case where an input gradation signal is included in a predetermined high tonal range or a predetermined low tonal range. The predetermined high tonal range and the predetermined low tonal range may be set by selecting a suitable range as appropriate in accordance with a configuration and specifications of the data driver.

A data driver according to the present disclosure can further include a table containing phase adjustment amounts corresponding to values of gradation signals, and the phase difference control unit can control the operation of the selector unit by referring to data contained in the table in accordance with the input gradation signal. The phase adjustment amounts may be set by selecting suitable values as appropriate by experiment or the like, in accordance with designs of the data driver and a display unit.

The display unit may have a configuration of so-called monochrome display, or may have a configuration of color display. In the case where the display unit has a configuration of color display, one pixel includes a plurality of types of subpixels with different display colors. Normally, one pixel is configured with three types of subpixels, such as a subpixel that displays red, a subpixel that displays green, and a subpixel that displays blue. A subpixel that displays white may be added to these three types of subpixels, for example, in order to improve luminance.

In the data drivers according to the first aspect of the present disclosure including the various preferred configurations described above (hereinafter, these are simply called data drivers of the present disclosure in some cases), in driving a plurality of types of subpixels with different emission colors, control can be performed to delay the output node selection operation by the selector unit in the case where the input gradation signal is included in the predetermined high tonal range or the predetermined low tonal range, with respect to driving of at least one type of subpixel.

In this case, control can be performed to delay the output node selection operation by the selector unit in the case where the input gradation signal is included in the predetermined high tonal range or the predetermined low tonal range, with respect to driving of a subpixel that displays a color with the highest luminosity.

As described above, in the case where the display unit has a configuration of color display, one pixel is normally configured with three types of subpixels, such as a subpixel that displays red, a subpixel that displays green, and a subpixel that displays blue. In this case, the above-described control can be performed in driving a subpixel that displays green, which has the highest luminosity. It is also possible to perform the above-described control in driving two types of subpixels, such as a green subpixel and a red subpixel, which has the second highest luminosity after green. Furthermore, it is possible to perform the above-described control in driving three types of subpixels, such as a green subpixel, a red subpixel, and a blue subpixel.

Alternatively, control can be performed to delay the output node selection operation by the selector unit in the case where the input gradation signal is included in the predetermined high tonal range or the predetermined low tonal range, with respect to driving of a subpixel that displays white.

It is possible to perform the above-described control in driving a subpixel that displays white in the case where, for example, a subpixel that displays white is added to improve luminance in a display unit of color display.

In the data drivers according to the present disclosure including the various preferred configurations described above, the phase difference control unit can perform control to delay the output node selection operation by the selector unit in the case where the input gradation signal is included in the predetermined high tonal range or the predetermined low tonal range and the absolute value of a difference between the input gradation signal and a gradation signal preceding the input gradation signal exceeds a predetermined reference value. The predetermined reference value may be set by selecting a suitable range as appropriate in accordance with a configuration and specifications of the data driver.

The data driver may have a configuration in which constituent portions are integrated into one body, or the constituent portions may be configured separately as appropriate. In the case of a configuration in which constituent portions are integrated, a resistance circuit can be configured with polysilicon resistors or the like formed on a chip. Circuits for generating reference voltages can be configured with known circuit elements, such as operational amplifiers. Various circuits constituting the selector unit, the phase difference control unit, and the like can include known circuits, such as a storage circuit and a logic circuit, and these can also be configured with known circuit elements. Note that a scanning unit and a power supply unit illustrated in FIG. 1, which are described later, can also be configured with known circuit elements.

Examples of a display unit used for a display device of the present disclosure include known display panels, such as a liquid crystal display panel and an electroluminescent display panel. The configuration of the display unit is not particularly limited as long as the display device can operate without hindrance.

Examples of values of pixels in the display unit include U-XGA (1600,1200), HD-TV (1920,1080), Q-XGA (2048, 1536), and some resolutions for image display, such as (3840,2160) and (7680,4320), but the values of pixels are not limited to these values.

Various conditions in this specification are satisfied when substantially established as well as when strictly established mathematically. Presence of various variations in design or production is allowed.

In timing charts used in the description below, the lengths (time lengths) of horizontal axes representing periods are schematic, and do not represent the proportion between the time lengths of the periods. The same applies to vertical axes. Shapes of waveforms in the timing charts are also schematic.

First Embodiment

A first embodiment relates to a data driver according to the first aspect of the present disclosure, a display device including the data driver, and an electronic apparatus including the display device.

FIG. 1 is a conceptual diagram of a display device according to the first embodiment. For convenience in illustration, FIG. 1 illustrates connection relations for one display element 10, more specifically, a (n,m)-th display element 10, which is described later.

A display device 1 includes a display unit 2 in which display elements 10 including a current-driven light-emitting portion and a driving circuit configured to drive the light-emitting portion are arranged in a two-dimensional matrix, being connected to scan lines SCL extending in a row direction (the X direction in FIG. 1) and data lines DTL extending in a column direction (the Y direction in FIG. 1), and a data driver 102 that applies voltage to the data lines DTL. A scanning signal is supplied to the scan lines SCL from a scanning unit 101. The light-emitting portion ELP included in the display element 10 is configured with an organic electroluminescent light-emitting portion, for example.

The display unit 2 further includes power supply lines PS1 connected to display elements 10 aligned in the row direction, and a second power supply line PS2 commonly connected to all the display elements 10. A predetermined driving voltage is supplied to the power supply line PS1 from a power supply unit 100. A common voltage (e.g., a ground potential) is supplied to the second power supply line PS2.

Although not illustrated in FIG. 1, a region in which the display unit 2 displays an image (display region) includes display elements 10 arranged in a two-dimensional matrix of N display elements 10 in the row direction and M display elements 10 in the column direction, i.e., N×M display elements 10 in total. The number of rows of display elements 10 in the display region is M, and the number of display elements 10 constituting each row is N.

The number of the scan lines SCL and the number of the power supply lines PS1 are M. Display elements 10 in the m-th row (m=1, 2, . . . , M) are connected to the m-th scan line $SCL_m$ and the m-th power supply line $PS1m$, and constitute one display element row. Note that FIG. 1 illustrates only the power supply line $PS1_m$.

The number of the data lines DTL is N. Display elements 10 in the n-th column (n=1, 2, . . . , N) are connected to the n-th data line $DTL_n$. Note that FIG. 1 illustrates only the data line $DTL_n$.

The display device 1 is a display device of color display, for example, in which one display element 10 constitutes one subpixel. Although not illustrated, one pixel is constituted by a set of a subpixel that displays red, a subpixel that displays green, and a subpixel that displays blue, which are aligned in the row direction. Accordingly, the display unit 2 includes pixels arranged in a two-dimensional matrix, more specifically, N/3 pixels in the row direction and M pixels in the column direction.

The display device 1 is subjected to line sequential scanning in units of rows by the scanning signal from the scanning unit 101. The display element 10 positioned in the m-th row and the n-th column is hereinafter called the (n,m)-th display element 10 or the (n,m)-th subpixel.

In the display device 1, display elements 10 constituting N subpixels arranged in the m-th row are driven concurrently. In other words, N display elements 10 arranged along the row direction have their emission/non-emission timings controlled in units of rows to which they belong. When a display frame rate of the display device 1 is expressed as FR (number of times/second), a scanning period per row (so-called horizontal scanning period) when the display device 1 is subjected to line sequential scanning in units of rows is less than (1/FR)×(1/M) seconds.

The data driver 102 according to the first embodiment includes: a resistance circuit to which a plurality of reference voltages with different values are applied, the resistance circuit including a plurality of output nodes configured to output the reference voltages and voltages obtained by dividing the reference voltages; a selector unit configured to select one of the plurality of output nodes in accordance with a value of an input gradation signal, and cause a voltage corresponding to the value of the gradation signal to be output; and a phase difference control unit configured to perform control to delay an output node selection operation by the selector unit in the case where an input gradation signal is included in a predetermined high tonal range or a predetermined low tonal range. Details of this configuration will be described later.

The data driver 102 further includes a table containing phase adjustment amounts corresponding to values of gradation signals. The phase difference control unit controls an operation of the selector unit by referring to data contained in the table in accordance with the input gradation signal. Details of this configuration will be described later.

To the data driver 102 of the display device 1, gradation signals $D_{Sig}$ corresponding to an image to be displayed are input from a device that is not illustrated, for example. Among the input gradation signals $D_{Sig}$, the gradation signal corresponding to the (n,m)-th display element 10 will be expressed as $D_{Sig(n,m)}$ in some cases.

For convenience in description, assume that the number of gradation bits of the gradation signal $D_{Sig(n,m)}$ is 12 bits. A gradation value is one of values 0 to 4095 depending on the luminance of an image to be displayed. Here, larger gradation values indicate higher luminances of an image to be displayed. Note that the number of gradation bits mentioned above is merely an example; the number of gradation bits may be 8 bits, 16 bits, or 24 bits, for example.

The display element 10 includes at least the current-driven light-emitting portion ELP, a write transistor $TR_W$, a drive transistor $TR_D$, and a capacitance portion $C_1$, and emits light when current flows to the light-emitting portion ELP via source/drain regions of the drive transistor $TR_D$.

The capacitance portion $C_1$ is used to retain a voltage of a gate electrode with respect to a source region (so-called gate-source voltage) of the drive transistor $TR_D$. In a light-emitting state of the display element 10, one source/drain region (the side connected to the power supply line PS1 in FIG. 1) of the drive transistor $TR_D$ functions as a drain region, and the other source/drain region (the side connected to one end, specifically, an anode electrode, of the light-emitting portion ELP) functions as a source region. One electrode and the other electrode constituting the capacitance portion $C_1$ are connected, respectively, to the other source/drain region and the gate electrode of the drive transistor $TR_D$.

The write transistor $TR_W$ includes a gate electrode connected to the scan line $SCL_n$, one source/drain region connected to the data line $DTL_n$, and the other source/drain region connected to the gate electrode of the drive transistor $TR_D$.

The gate electrode of the drive transistor $TR_D$ is connected to the other source/drain region of the write transistor $TR_W$ and the other electrode of the capacitance portion $C_1$, and the other source/drain region of the drive transistor $TR_D$ is connected to the one electrode of the capacitance portion $C_1$ and the anode electrode of the light-emitting portion ELP.

The other end (specifically, a cathode electrode) of the light-emitting portion ELP is connected to the second power supply line PS2. A capacitance of the light-emitting portion ELP is denoted by $C_{EL}$.

In a state where a voltage corresponding to the luminance of an image to be displayed is supplied from the data driver 102 to the data line $DTL_n$, when the write transistor $TR_W$ is brought into conduction by the scanning signal from the scanning unit 101, the voltage corresponding to the luminance of the image to be displayed is written in the capacitance portion $C_1$. After the write transistor $TR_W$ is brought out of conduction, a current flows to the drive transistor $TR_D$ in accordance with the voltage retained in the capacitance portion $C_1$, and the light-emitting portion ELP emits light.

Figure 2:
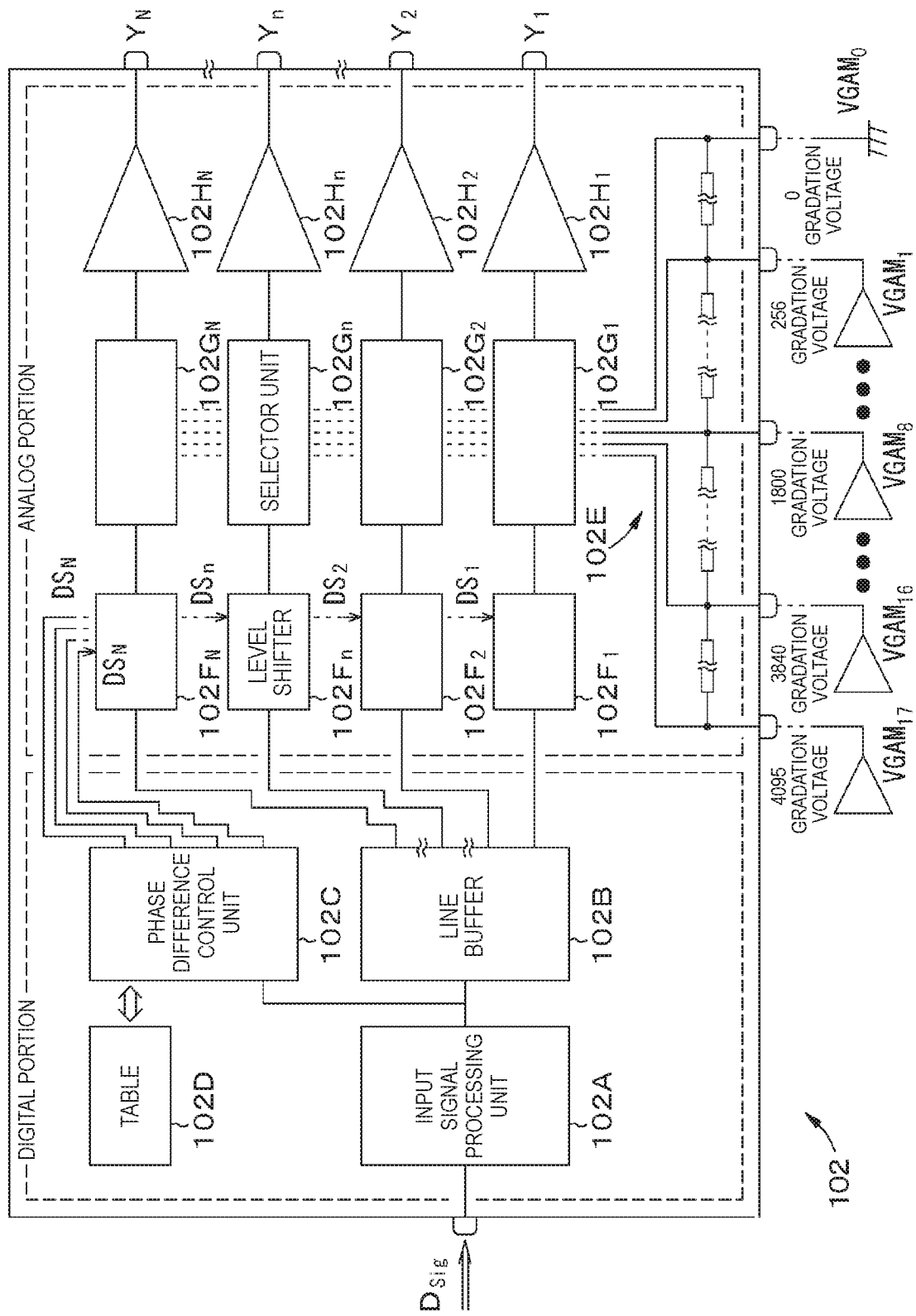
FIG. 2 is a schematic circuit diagram for describing a configuration of a data driver used for a display device.

FIG. 2 is a schematic circuit diagram for describing a configuration of a data driver used for a display device. Although the data driver 102 is described to be configured as one semiconductor integrated circuit, this is merely an example. For example, N data lines DTL may be driven by a plurality of semiconductor integrated circuits.

The data driver 102 is broadly divided into a digital portion in the preceding stage, to which a gradation signal is input, and an analog portion in the subsequent stage, which outputs a voltage corresponding to a value of the gradation signal. The digital portion includes an input signal processing unit 102A, a line buffer 102B, a phase difference control unit 102C, a table 102D, and the like.

The analog portion includes a resistance circuit 102E, level shifters 102F, selector units 102G output amplifiers 102H, and the like. N level shifters 102F, N selector units 102G, and N output amplifiers 102H are provided in correspondence with the data lines DTL. The resistance circuit 102E is used commonly for the selector units 102G.

A plurality of reference voltages with different values are applied to the resistance circuit. In the illustrated example, reference voltages denoted by $VGAM_0$ to $VGAM_{17}$ are applied from the outside. The reference voltages are set so as to satisfy a relation in height of $VGAM_{17} > VGAM_{16} > VGAM_{15} > \ldots > VGAM_1 > VGAM_0$. These reference voltages are supplied from operational amplifiers, for example.

To the digital portion in the preceding stage, signals including gradation signals $D_{Sig(1,1)}$ to $D_{Sig(N,M)}$ are input as differential signals of a serial communication system. The input signal processing unit 102A performs predetermined processing for signals input in accordance with an image to be displayed, and outputs gradation signals $D_{sig(1,1)}$ to $D_{Sig(N,M)}$ serving as digital data.

For the display device 1 to be subjected to line sequential scanning in units of rows, processing of signals is performed for each row. For convenience in description, description will be given assuming that processing corresponding to subpixels in the m-th row is performed.

The line buffer 102B is constituted by a semiconductor memory, for example, and retains gradation signals $D_{Sig(1,m)}$ to $D_{Sig(N,m)}$ of the m-th row, which are output as serial data by the input signal processing unit 102A.

The phase difference control unit 102C refers to the table 102D on the basis of values of the gradation signals $D_{Sig(1,m)}$ to $D_{Sig(N,m)}$, and sends control signals $DS_1$ to $DS_N$ to the level shifters $102F_1$ to $102F_N$, thereby controlling timings at which the level shifters 102F corresponding to the data lines DTL control the selector units 102G Specific operations will be described in detail later with reference to FIGS. 8A and 8B to 13A and 13B.

The selector units $102G_1$ to $102G_N$ select output nodes corresponding to the gradation signals $D_{Sig(1,m)}$ to $D_{Sig(N,m)}$. The output amplifiers $102H_1$ to $102H_N$ supply output voltages $Y_1$ to $Y_N$ to the data lines $DTL_1$ to $DTL_N$ on the basis of voltages of the output nodes selected by the corresponding selector units 102G.

Figure 3:
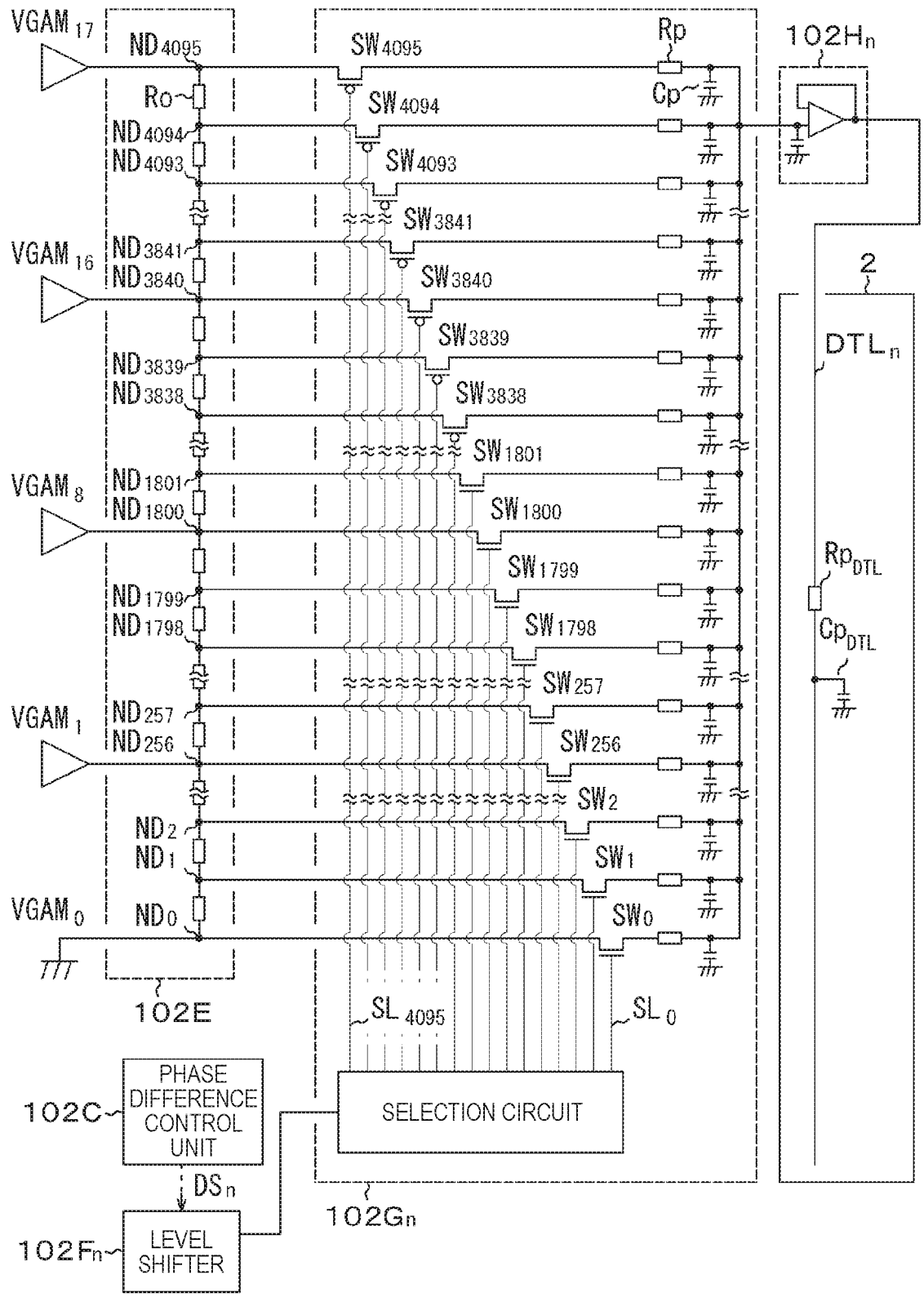
FIG. 3 is a schematic circuit diagram for describing a configuration of a data driver in a portion contributing to driving of the n-th data line.

FIG. 3 is a schematic circuit diagram for describing a configuration of a data driver in a portion contributing to driving of the n-th data line.

The resistance circuit 102E includes a plurality of resistance elements denoted by Ro connected in series between adjacent reference voltages.

In the example illustrated in FIG. 2, a plurality of resistance elements Ro are connected in series between the reference voltage $VGAM_{17}$ and the reference voltage $VGAM_{16}$ to form output nodes ND4095 to $ND_{3840}$ that output voltages corresponding to gradation values 4095 to 3840. Basically the same configuration applies to between other adjacent reference voltages.

Depending on specifications of the display unit 2, the reference voltage $VGAM_{17}$ is set to a value of several volts to several tens of volts, for example. Values of reference voltages, the number of a plurality of resistance elements Ro connected in series between adjacent reference voltages, and the like are set in a manner that voltages output by output nodes $ND_{4095}$ to $ND_0$ change linearly. Note that the present disclosure is not limited to such a configuration. For example, to compensate for nonlinearity of characteristics in the display unit 2, values of reference voltages, the number of a plurality of resistance elements Ro connected in series between adjacent reference voltages, and the like may be set in a manner that voltages of the output nodes ND change nonlinearly.

The output nodes $ND_{4095}$ to $ND_0$ are connected to the input side of the output amplifier $102H_n$ via switch elements $SW_{4095}$ to $SW_0$ configured with transistors, for example. The conduction/non-conduction of the switch elements $SW_{4095}$ to $SW_0$ is controlled by signals supplied to control lines $SL_{4095}$ to $SL_0$ from a selection circuit.

The output side of the output amplifier $102H_n$ is connected to the data line $DTL_n$ of the display unit 2. Accordingly, the data line $DTL_n$ is driven by a voltage output by the output amplifier $102H_n$. $Rp_{DTL}$ and $Cp_{DTL}$ denote, respectively, a resistance component and a parasitic capacitance of the data line $DTL_n$.

For example, in displaying an image of gradation value 4095, the switch element $SW_{4095}$ is selected to connect the output node $ND_{4095}$ to the input side of the output amplifier $102H_n$. In displaying an image of gradation value 4094, the switch element $SW_{4094}$ is selected to connect the output node $ND_{4094}$ to the input side of the output amplifier $102H_n$. In displaying an image of gradation value 4093, the switch element $SW_{4093}$ is selected to connect the output node $ND_{4093}$ to the input side of the output amplifier $102H_n$. The same applies to display of other gradation values.

The switch element SW can be constituted by a MOS transistor, for example. The gate-source voltage in selecting the switch element SW is decided by the voltage of the output node ND to be selected. Accordingly, even if the gate voltage in selection is the same, on-resistance differs between switch elements SW connected to different output nodes ND.

Figure 4:
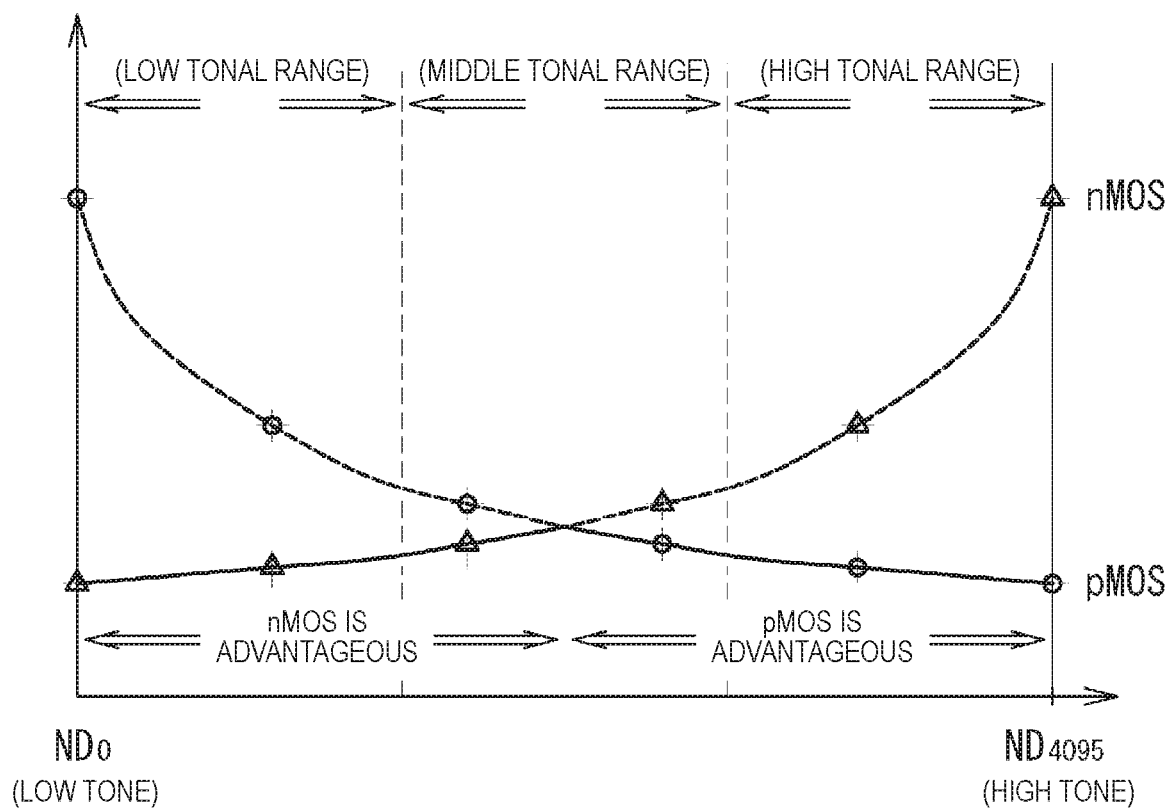
FIG. 4 is a schematic graph for describing on-resistances of switch elements included in a data driver.

FIG. 4 is a schematic graph for describing on-resistances of switch elements included in a data driver.

As illustrated in FIG. 4, if all the switch elements SW are transistors of the same conductivity type (for example, all pMOS or all nMOS), a phenomenon occurs in which on-resistance becomes higher at the lower-tone side or at the higher-tone side.

In terms of enhancing the speed of the data driver 102, for example, the switch element SW preferably has low on-resistance. Therefore, in the selector unit 102G, switch elements SW at the high-tone side are constituted by pMOS transistors, and switch elements SW at the low-tone side are constituted by nMOS transistors. If the range of gradation is divided into three ranges of a predetermined high tonal range, a predetermined low tonal range, and a middle tonal range between the high tonal range and the low tonal range, on-resistances of the switch elements SW in displaying the high tonal range and on-resistances of the switch elements SW in displaying the low tonal range are relatively lower than on-resistances of the switch elements SW in displaying the middle tonal range.

Here, to aid the understanding of the present disclosure, description is given on a slew rate in a configuration from which the phase difference control unit 102C and the like illustrated in FIG. 2 are eliminated, specifically, a data driver serving as a reference example in which timing control of the level shifters 102F is not performed.

Figure 6A:
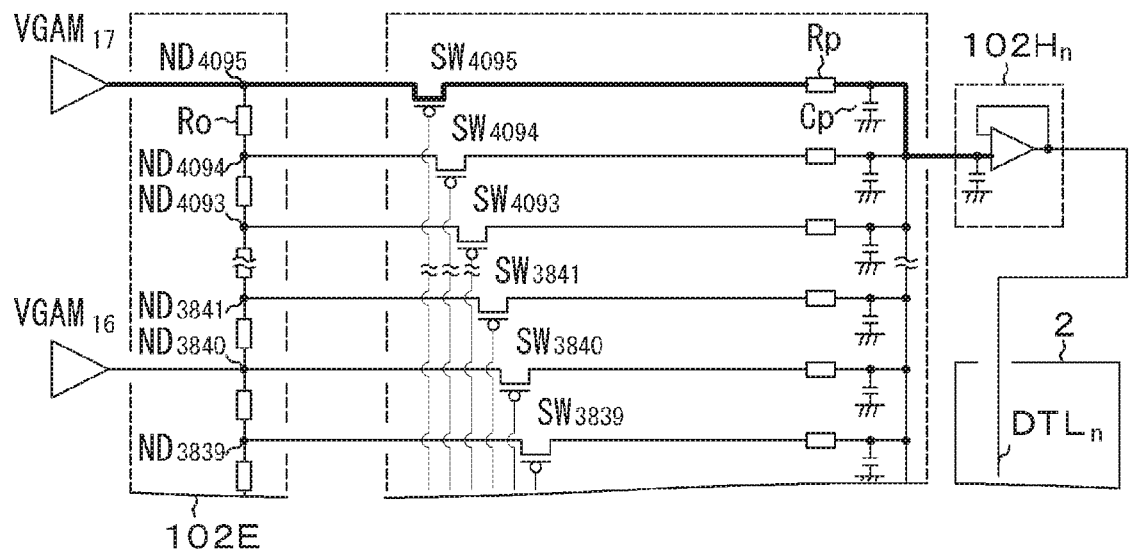
FIGS. 6A and 6B FIG. 6A is a schematic circuit diagram for describing an operation when a reference voltage is selected to be output.
Figure 6B:
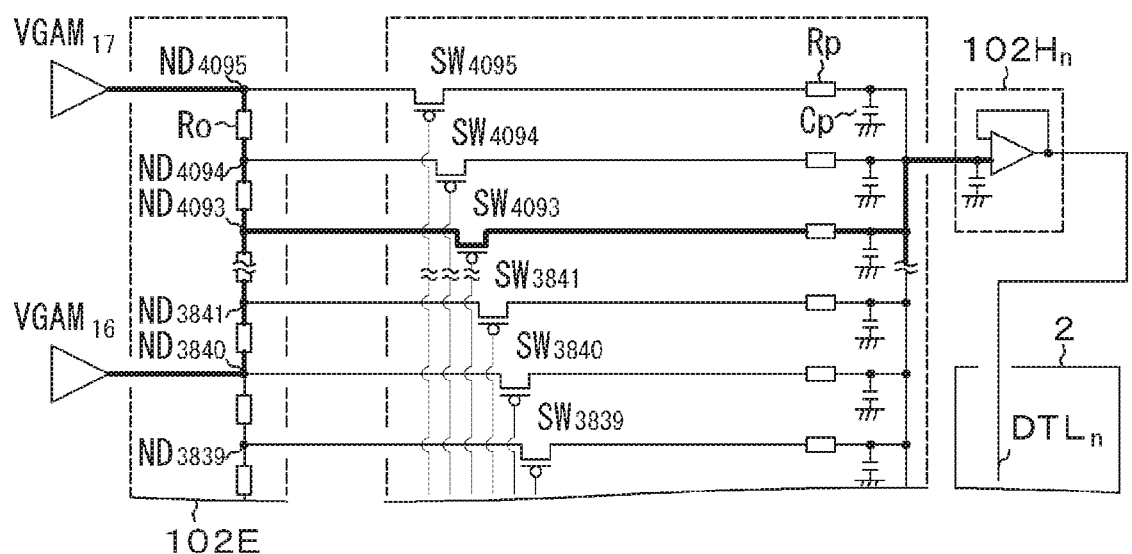

FIG. 5 is a schematic circuit diagram for describing a configuration of a data driver 102' serving as a reference example. FIG. 6A is a schematic circuit diagram for describing an operation when a reference voltage is selected to be output. FIG. 6B is a schematic circuit diagram for describing an operation when a voltage of an output node is selected to be output.

FIG. 6A schematically illustrates a case where the reference voltage $VGAM_{17}$ is selected to be output. In this case, a resistance element Ro that forms the resistance circuit 102E is not present on a path from the output node $ND_{4095}$ to the input side of the output amplifier $102H_n$. Accordingly, the resistance component Rp and the parasitic capacitance Cp of the path mainly exert influence on signal propagation.

FIG. 6B schematically illustrates a case where the voltage of the output node $ND_{4093}$ is selected to be output. In this case, a resistance element Ro that forms the resistance circuit 102E is present on a path from the output node $ND_{4093}$ to the input side of the output amplifier $102H_n$. Accordingly, in addition to the resistance component Rp and the parasitic capacitance Cp of the path, the resistance element Ro exerts influence on signal propagation. Qualitatively, signal delay becomes larger than that in FIG. 6A. Moreover, an increase in the number of resistance elements Ro present on the path increases signal delay.

Figure 7A:
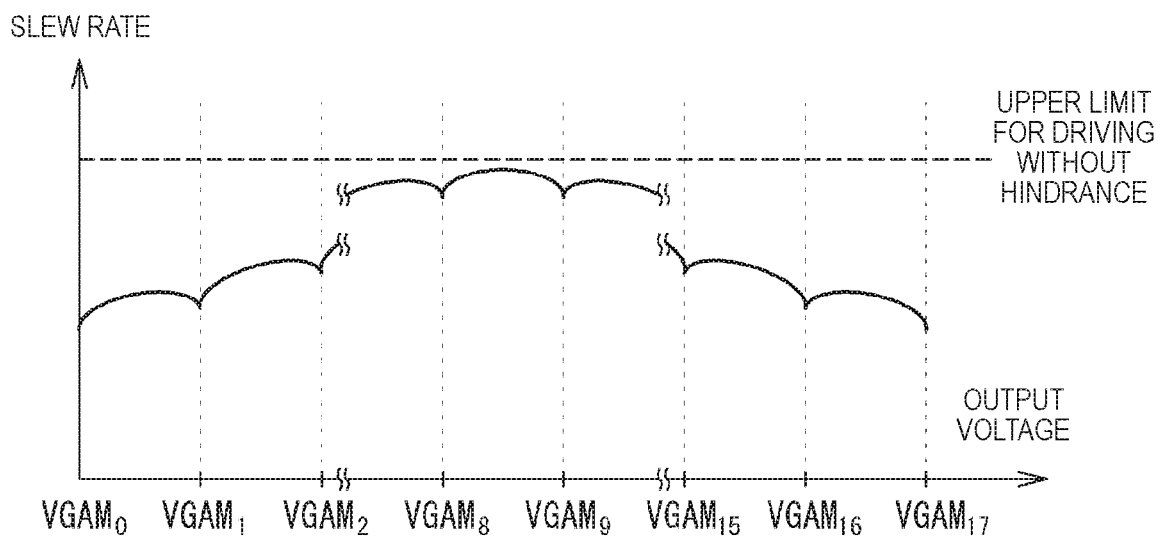
FIGS. 7A and 7B FIG. 7A is a schematic graph for describing the relation between an output voltage output from an output amplifier and a slew rate.
Figure 7B:
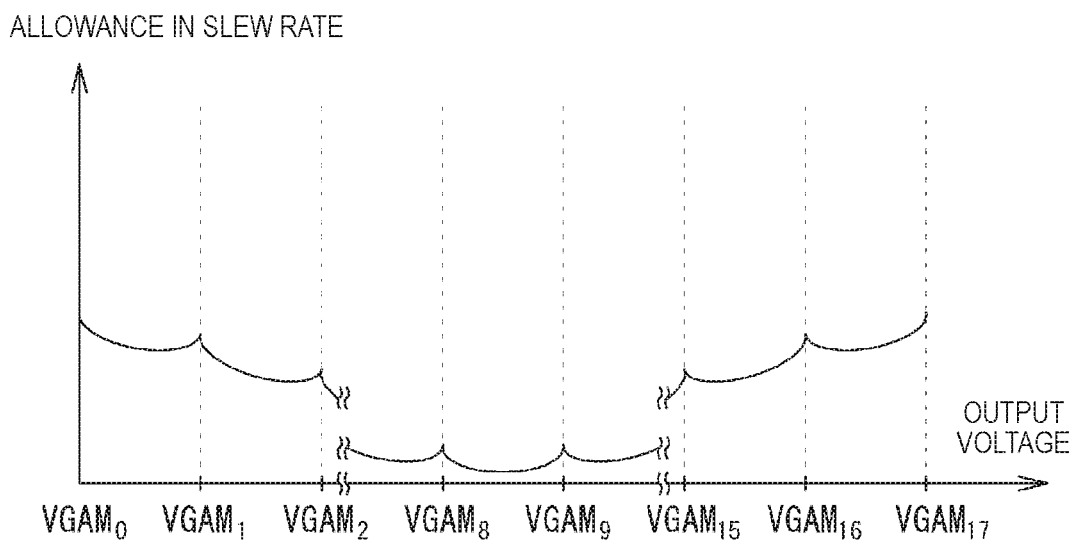

FIG. 7A is a schematic graph for describing the relation between an output voltage output from an output amplifier and a slew rate. FIG. 7B is a schematic graph for describing the relation between an output voltage output from an output amplifier and an allowance in slew rate.

As described above, on-resistances of the switch elements SW in displaying the high tonal range and on-resistances of the switch elements SW in displaying the low tonal range are relatively lower than on-resistances of the switch elements SW in displaying the middle tonal range. Moreover, a delay when a voltage obtained by dividing a reference voltage is output is larger than a delay when the reference voltage is output. Consequently, a slew rate in the data driver 102' serving as a reference example is schematically expressed as in FIG. 7A. Accordingly, as long as the middle tonal range can be driven without hindrance, there is an allowance in slew rate as illustrated in FIG. 7B in driving of the high tonal range and the low tonal range. This means that there is an allowance in settling time in the case where driving of the high tonal range and the low tonal range is performed.

With a focus on the allowance in settling time described above, in the data driver 102 according to the first embodiment, node selection by the selector unit 102G is delayed in the case where the input gradation signal is included in the predetermined high tonal range or the predetermined low tonal range. This relatively dampens a change in charge and discharge current in the entire data driver 102, which flows in driving of the data lines DTL of the display unit 2; thus, EMI accompanying the operation of the data driver 102 is also reduced. In addition, since control is performed in accordance with a value of the input gradation signal, fixed light and dark stripes do not occur.

In the first embodiment, in driving a plurality of types of subpixels with different display colors, control can be performed to delay a change in a voltage to be selected by the selector unit 102G in the case where the input gradation signal is included in the predetermined high tonal range or the predetermined low tonal range, with respect to driving of at least one type of subpixel.

Description will be given on a case where control is performed to delay a change in a voltage to be selected by the selector unit 102G in the case where the input gradation signal is included in the predetermined high tonal range or the predetermined low tonal range, with respect to driving of a subpixel that displays a color with the highest luminosity.

Figure 8A:
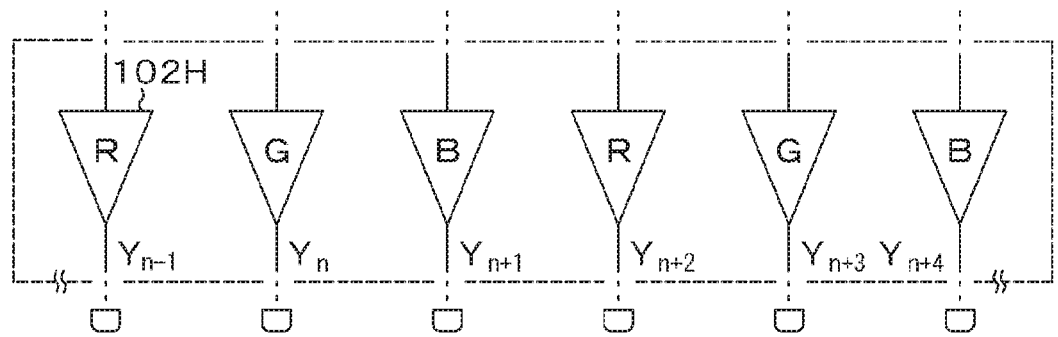
FIGS. 8A and 8B FIG. 8A is a schematic diagram for describing connection relations of a data driver when a display unit including subpixels that display red, green, and blue is driven.
Figure 8B:
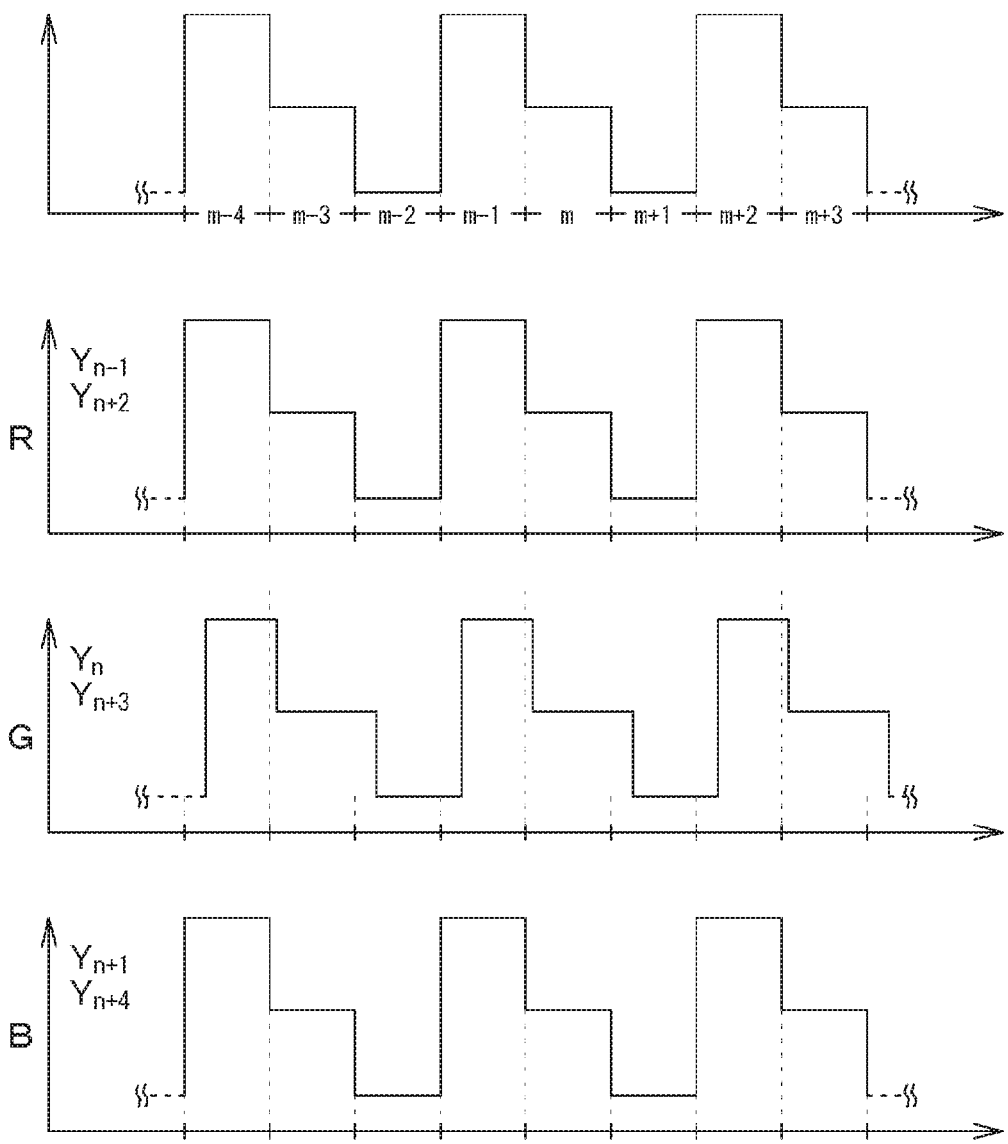

FIG. 8A is a schematic diagram for describing connection relations of a data driver when a display unit including subpixels that display red, green, and blue is driven. FIG. 8B is a schematic diagram for describing an example when selection of an output node by a selector unit is controlled in driving of a subpixel that displays green, which has the highest luminosity among red, green, and blue. FIG. 9 is a table for describing a configuration of a table, for example.

In this configuration, control is performed in a manner that a phase is delayed in outputting voltages for a high tone and a low tone, with respect to output voltages $Y_n$ and $Y_{n+3}$, which are involved in driving of subpixels that display green.

Figure 10A:
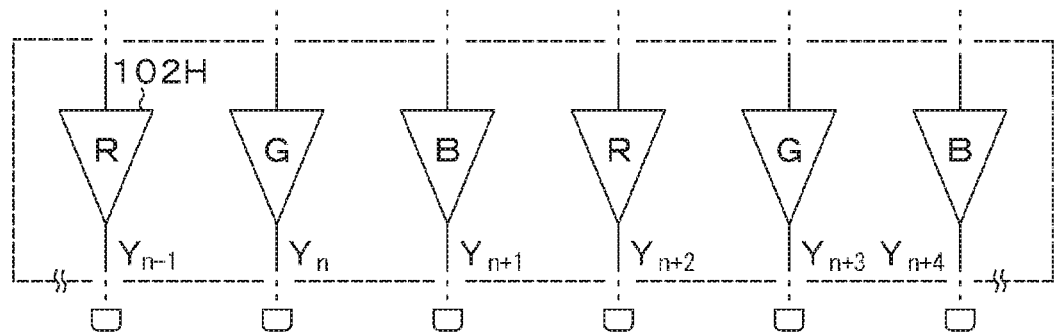
FIGS. 10A and 10B FIG. 10A is a schematic diagram for describing connection relations of a data driver when a display unit including subpixels that display red, green, and blue is driven.
Figure 10B:
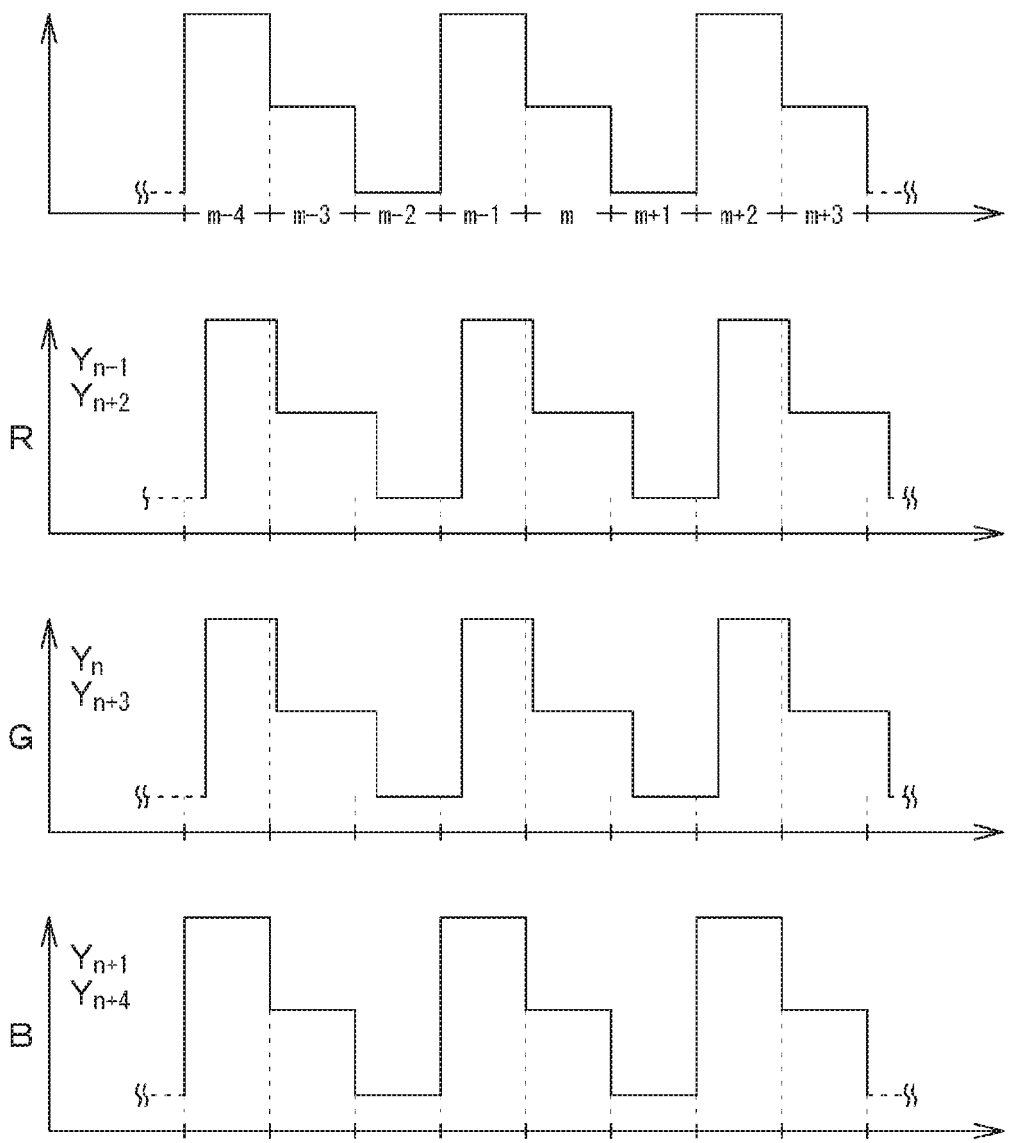

The phase difference control unit 102C illustrated in FIG. 2 refers to values of the table 102D on the basis of values of gradation signals involved in display of green. Data as shown in FIGS. 10A and 10B is contained in a nonvolatile storage device constituting the table 102D. The phase difference control unit 102C generates control signals DS to delay operation timings of the selector units 102G in correspondence with values read from the table 102D. By control of the operation timings of the selector units 102G, input timings of the output amplifiers 102H are also controlled to be delayed; thus, timings at which the output voltages Yn and Yn+3 change are controlled to be delayed.

Now, description will be given on a case where control is performed to delay a change in a voltage to be selected by the selector unit 102G in the case where the input gradation signal is included in the predetermined high tonal range or the predetermined low tonal range, with respect to driving of a subpixel that displays a color with the highest luminosity and a subpixel that displays a color with the second highest luminosity.

FIG. 10A is a schematic diagram for describing connection relations of a data driver when a display unit including subpixels that display red, green, and blue is driven. FIG. 10B is a schematic diagram for describing an example when selection of an output node by a selector unit is controlled in driving of a subpixel that displays green, which has the highest luminosity among red, green, and blue, and a subpixel that displays red, which has the second highest luminosity. FIG. 11 is a table for describing a configuration of a table, for example.

In this configuration, control is performed in a manner that a phase is delayed in outputting voltages for a high tone and a low tone, with respect to output voltages $Y_n$ and $Y_{n+3}$, which are involved in driving of subpixels that display green, and output voltages $Y_{n-1}$ and $Y_{n+2}$, which are involved in driving of subpixels that display red.

The phase difference control unit 102C illustrated in FIG. 2 refers to values of the table 102D on the basis of values of gradation signals involved in display of green and values of gradation signals involved in display of red. Data as shown in FIG. 11 is contained in the table 102D. The phase difference control unit 102C generates control signals DS to delay operation timings of the selector units 102G in correspondence with values read from the table 102D. By control of the operation timings of the selector units 102G, input timings of the output amplifiers 102H are also controlled to be delayed; thus, timings at which the output voltages $Y_n$ and $Y_{n+3}$ and the output voltages $Y_{n-1}$ and $Y_{n+2}$ change are controlled to be delayed.

Now, description will be given on a case where control is performed to delay a change in a voltage to be selected by the selector unit 102G in the case where the input gradation signal is included in the predetermined high tonal range or the predetermined low tonal range, with respect to driving of a subpixel that displays white.

As described above, a subpixel that displays white may be added to the three types of subpixels mentioned above in order to improve luminance in a display unit of color display. In this case, one pixel includes subpixels that display red, green, and blue and a subpixel that displays white. In such a configuration, it is possible to perform the above-described control in driving a subpixel that displays white.

Figure 12A:
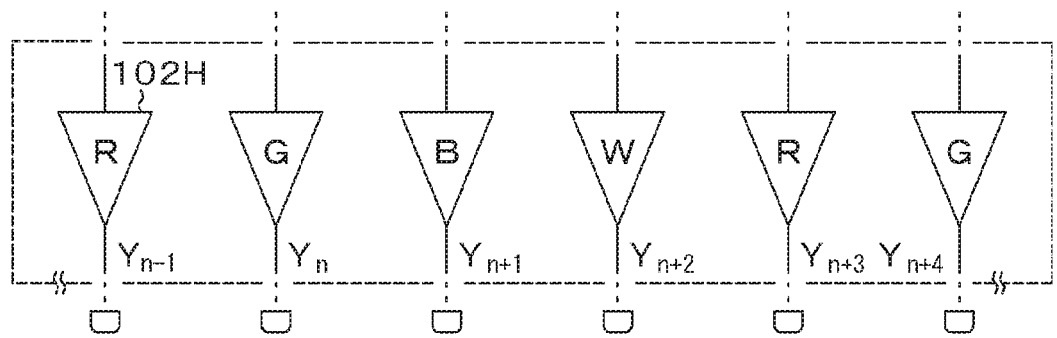
FIGS. 12A and 12B FIG. 12A is a schematic diagram for describing connection relations of a data driver when a display unit including subpixels that display red, green, blue, and white is driven.
Figure 12B:
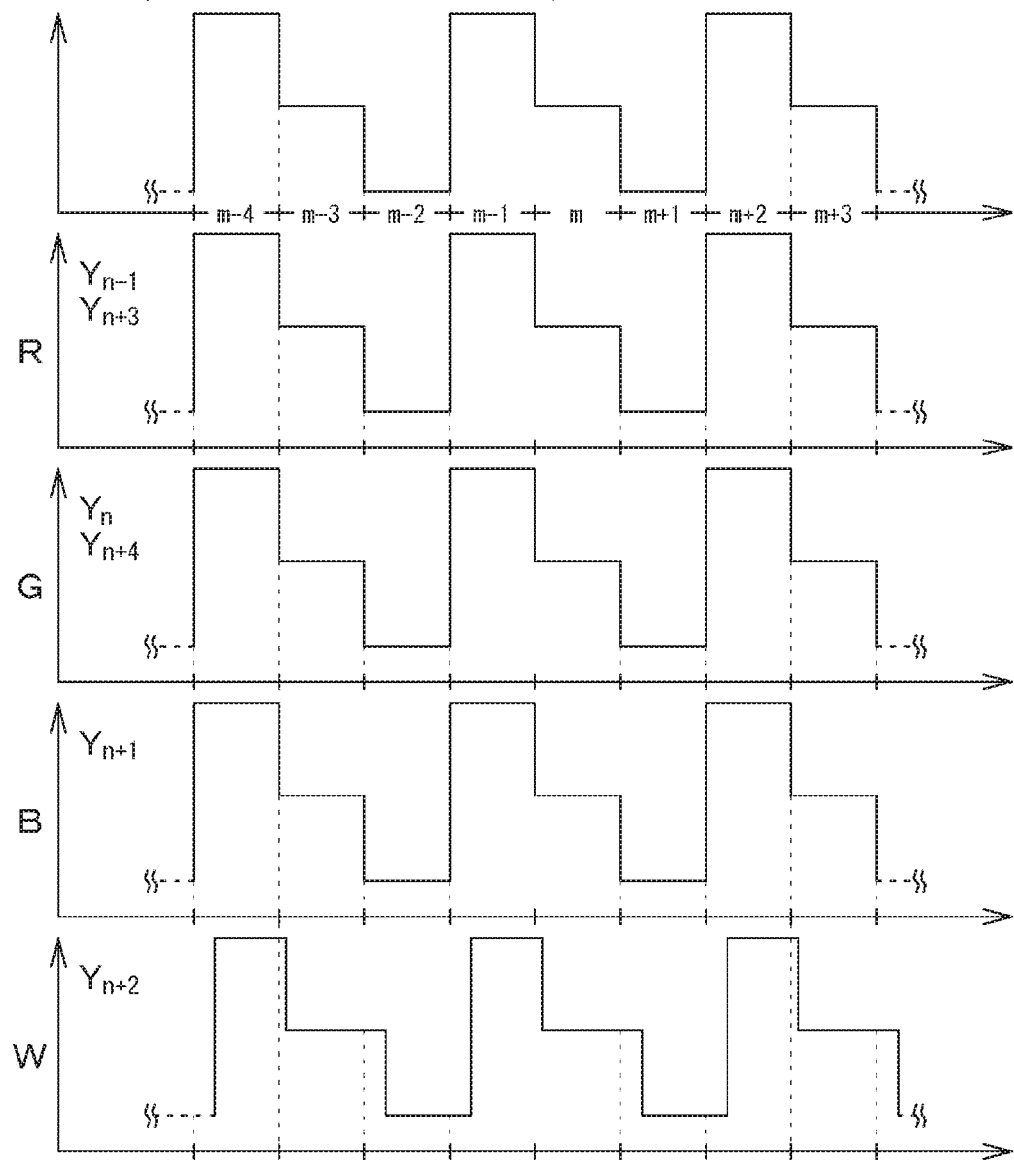

FIG. 12A is a schematic diagram for describing connection relations of a data driver when a display unit including subpixels that display red, green, blue, and white is driven. FIG. 12B is a schematic diagram for describing an example when, in driving a display unit including subpixels that display red, green, blue, and white, selection of an output node by a selector unit is controlled in driving of a subpixel that displays white.

In this configuration, control is performed in a manner that a phase is delayed in outputting voltages for a high tone and a low tone, with respect to output voltages $Y_{n+2}$ and $Y_{n+4}$, which are involved in driving of subpixels that display white. A configuration of the table 102D is omitted because, basically, it can be found by reading "delay amount in driving for red" in FIG. 9 as "delay amount in driving for white".

In the above-described examples, the selector unit 102G is controlled solely on the basis of a value of the input gradation signal. However, in the case where the input gradation signal and a gradation signal preceding the input gradation signal are the same values, for example, only slight EMI occurs because a current change accompanying charge and discharge of the data line DTL is small.

In view of this point, control can be performed to delay a change in a voltage to be selected by the selector unit 102G in the case where the input gradation signal is included in the predetermined high tonal range or the predetermined low tonal range and the absolute value of a difference between the input gradation signal and a gradation signal preceding the input gradation signal exceeds a predetermined reference value.

In this case, the phase difference control unit 102C illustrated in FIG. 2 may determine the absolute value of the difference between the input gradation signal and the gradation signal preceding the input gradation signal, and perform the above-described operation only when the difference exceeds the predetermined reference value.

Figure 13A:
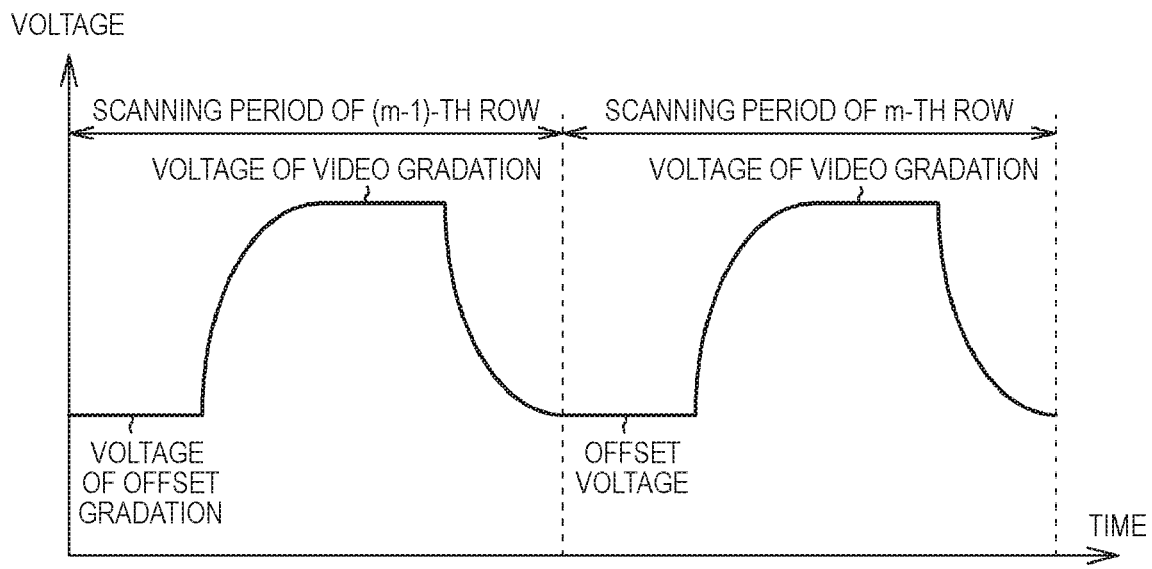
Figure 13B:
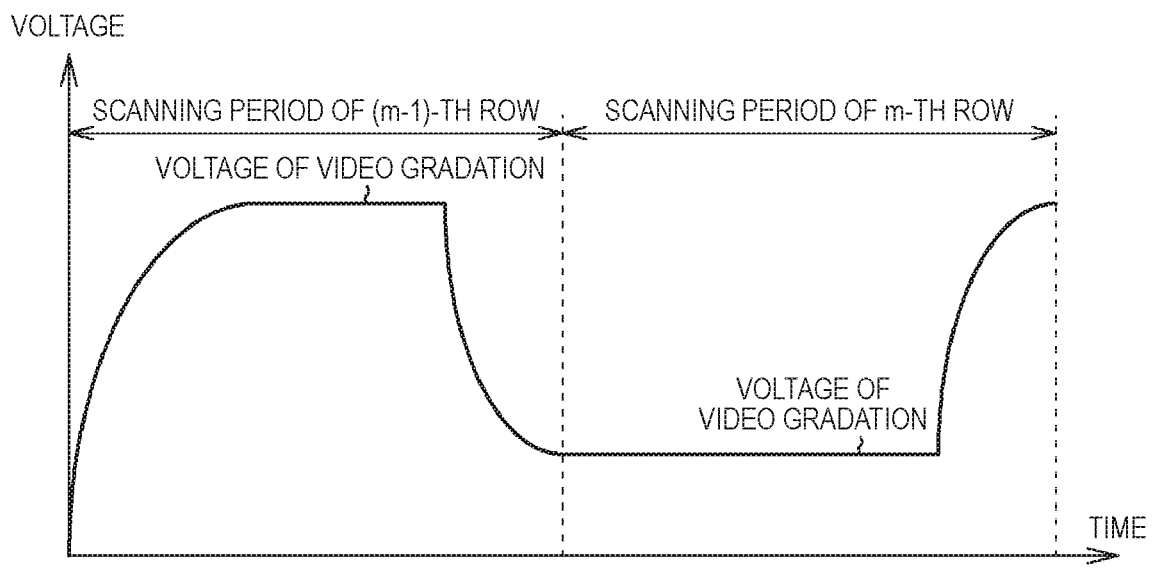
FIG. 13B is a schematic diagram for describing an example when, in driving a display unit including subpixels that display red, green, blue, and white, selection of an output node by a selector unit is controlled in driving of a subpixel that displays white.

Depending on specifications of a display device, a configuration in which video signal voltages are written alternately, or a configuration in which an offset voltage for pre-charging or the like and a video signal voltage are written in combination may be employed. FIG. 13A is a schematic graph for describing driving accompanied by offset writing operation. FIG. 13B is a schematic graph for describing driving not accompanied by offset writing operation.

In the case illustrated in FIG. 13A, for example, the absolute value of offset gradation and video gradation may be determined, and the above-described delay control may be performed with respect to video signal voltages only when the difference exceeds a predetermined reference value.

In the case illustrated in FIG. 13B, the absolute value of input video gradation and video gradation preceding the input video gradation may be determined, and the above-described delay control may be performed with respect to video signal voltages only when the difference exceeds a predetermined reference value.

APPLICATION EXAMPLES (EXAMPLES OF ELECTRONIC APPARATUSES)

Examples of application of the above-described display device to electronic apparatuses will be described. Examples of electronic apparatuses include an electronic apparatus that displays video signals input from the outside or video signals generated internally as an image or video.

Application Example 1

Figure 14:
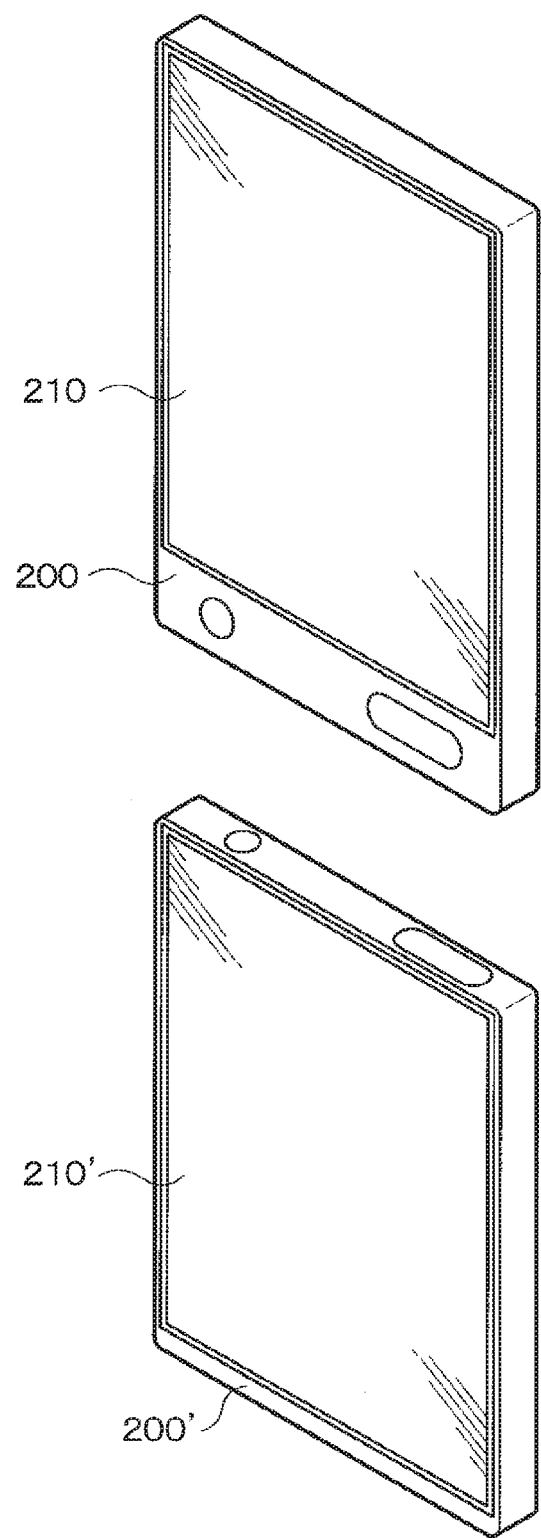
FIG. 14 is perspective views illustrating the appearance of an application example 1 of a display device of an embodiment.

FIGS. 14A and 14B each illustrate the appearance of a smartphone to which the display device of the above embodiment is applied. Smartphones 200 and 200' include, for example, display screen portions 210 and 210', respectively. These display screen portions 210 and 210' are each configured with the display device of the above embodiment. Applying the display device of the above embodiment enables effective suppression of shading, which contributes to improved quality of the smartphones 200 and 200'.

Application Example 2

Figure 15:
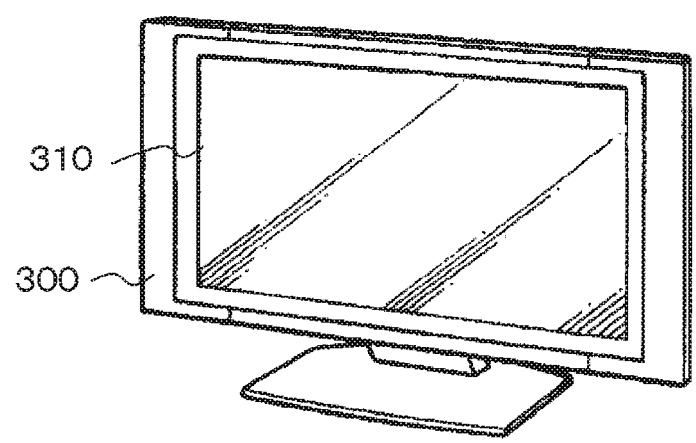
FIG. 15 is a perspective view illustrating the appearance of an application example 2 of a display device of an embodiment.

FIG. 15 illustrates the appearance of a television device to which the display device of the above embodiment is applied. A television device 300 includes, for example, a video display screen portion 301. This video display screen portion 301 is configured with the display device of the embodiment. Applying the display device of the above embodiment enables effective suppression of shading, which contributes to improved quality of the television device 300.

The embodiment of the present disclosure has been specifically described above, whilst the present disclosure is not limited to the above-described embodiment, and may include various modifications based on the technical scope of the present disclosure. For example, the numerical values, the configurations, the substrates, the materials, the processes, and the like exemplified in the above-described embodiment are merely examples. Numerical values, configurations, substrates, materials, processes, and the like different therefrom may be used, as necessary.

Additionally, the present technology may also be configured as below.

[1]

A data driver configured to be used for driving a display unit that includes pixels arranged in a two-dimensional matrix, the data driver including:

a resistance circuit to which a plurality of reference voltages with different values are applied, the resistance circuit including a plurality of output nodes configured to output the reference voltages and voltages obtained by dividing the reference voltages;

a selector unit configured to select one of the plurality of output nodes in accordance with a value of an input gradation signal, and cause a voltage corresponding to the value of the gradation signal to be output; and a phase difference control unit configured to perform control to delay an output node selection operation by the selector unit in the case where an input gradation signal is included in a predetermined high tonal range or a predetermined low tonal range.

[2]

The data driver according to [1], further including a table containing phase adjustment amounts corresponding to values of gradation signals, wherein the phase difference control unit controls an operation of the selector unit by referring to data contained in the table in accordance with the input gradation signal.

[3]

The data driver according to [1] or [2], wherein, in driving a plurality of types of subpixels with different display colors, control is performed to delay the output node selection operation by the selector unit in the case where the input gradation signal is included in the predetermined high tonal range or the predetermined low tonal range, with respect to driving of at least one type of subpixel.

[4]

The data driver according to [3], wherein control is performed to delay the output node selection operation by the selector unit in the case where the input gradation signal is included in the predetermined high tonal range or the predetermined low tonal range, with respect to driving of a subpixel that displays a color with the highest luminosity.

[5]

The data driver according to [3], wherein control is performed to delay the output node selection operation by the selector unit in the case where the input gradation signal is included in the predetermined high tonal range or the predetermined low tonal range, with respect to driving of a subpixel that displays white.

[6]

The data driver according to any of [1] to [5], wherein the phase difference control unit performs control to delay the output node selection operation by the selector unit in the case where the input gradation signal is included in the predetermined high tonal range or the predetermined low tonal range and an absolute value of a difference between the input gradation signal and a gradation signal preceding the input gradation signal exceeds a predetermined reference value.

[7]

A display device including:
a display unit that includes pixels arranged in a two-dimensional matrix; and
a data driver configured to be used for driving the display unit,
wherein the data driver includes
a resistance circuit to which a plurality of reference voltages with different values are applied, the resistance circuit including a plurality of output nodes configured to output the reference voltages and voltages obtained by dividing the reference voltages,
a selector unit configured to select one of the plurality of output nodes in accordance with a value of an input gradation signal, and cause a voltage corresponding to the value of the gradation signal to be output, and
a phase difference control unit configured to perform control to delay an output node selection operation by the selector unit in the case where an input gradation signal is included in a predetermined high tonal range or a predetermined low tonal range.

[8]

The display device according to [7], further including
a table containing phase adjustment amounts corresponding to values of gradation signals,
wherein the phase difference control unit controls an operation of the selector unit by referring to data contained in the table in accordance with the input gradation signal.

[9]

The display device according to [7] or [8], wherein, in driving a plurality of types of subpixels with different display colors, control is performed to delay the output node selection operation by the selector unit in the case where the input gradation signal is included in the predetermined high tonal range or the predetermined low tonal range, with respect to driving of at least one type of subpixel.

[10]

The display device according to [9], wherein control is performed to delay the output node selection operation by the selector unit in the case where the input gradation signal is included in the predetermined high tonal range or the predetermined low tonal range, with respect to driving of a subpixel that displays a color with the highest luminosity.

[11]

The display device according to [9], wherein control is performed to delay the output node selection operation by the selector unit in the case where the input gradation signal is included in the predetermined high tonal range or the predetermined low tonal range, with respect to driving of a subpixel that displays white.

[12]

The display device according to any of [7] to [11], wherein the phase difference control unit performs control to delay the output node selection operation by the selector unit in the case where the input gradation signal is included in the predetermined high tonal range or the predetermined low tonal range and an absolute value of a difference between the input gradation signal and a gradation signal preceding the input gradation signal exceeds a predetermined reference value.

[13]

An electronic apparatus including
a display device,
the display device including
a display unit that includes pixels arranged in a two-dimensional matrix, and
a data driver configured to be used for driving the display unit,
wherein the data driver includes
a resistance circuit to which a plurality of reference voltages with different values are applied, the resistance circuit including a plurality of output nodes configured to output the reference voltages and voltages obtained by dividing the reference voltages,
a selector unit configured to select one of the plurality of output nodes in accordance with a value of an input gradation signal, and cause a voltage corresponding to the value of the gradation signal to be output, and
a phase difference control unit configured to perform control to delay an output node selection operation by the selector unit in the case where an input gradation signal is included in a predetermined high tonal range or a predetermined low tonal range.

[14]

The electronic apparatus according to [13], further including
a table containing phase adjustment amounts corresponding to values of gradation signals,
wherein the phase difference control unit controls an operation of the selector unit by referring to data contained in the table in accordance with the input gradation signal.

[15]

The electronic apparatus according to [13] or [14], wherein, in driving a plurality of types of subpixels with different display colors, control is performed to delay the output node selection operation by the selector unit in the case where the input gradation signal is included in the predetermined high tonal range or the predetermined low tonal range, with respect to driving of at least one type of subpixel.

[16]

The electronic apparatus according to [15], wherein control is performed to delay the output node selection operation by the selector unit in the case where the input gradation signal is included in the predetermined high tonal range or the predetermined low tonal range, with respect to driving of a subpixel that displays a color with the highest luminosity.

[17]

The electronic apparatus according to [15], wherein control is performed to delay the output node selection operation by the selector unit in the case where the input gradation signal is included in the predetermined high tonal range or the predetermined low tonal range, with respect to driving of a subpixel that displays white.

[18]

The electronic apparatus according to any of [13] to [17], wherein the phase difference control unit performs control to delay the output node selection operation by the selector unit in the case where the input gradation signal is included in the predetermined high tonal range or the predetermined low tonal range and an absolute value of a difference between the input gradation signal and a gradation signal preceding the input gradation signal exceeds a predetermined reference value.

REFERENCE SIGNS LIST 1 display device
2 display unit
10 display element (pixel or subpixel)
SCL scan line
DTL data line
PS1 power supply line
PS2 second power supply line
$TR_W$ write transistor
$TR_D$ drive transistor
$C_1$ capacitance portion
ELP light-emitting portion
CEL capacitance of light-emitting portion ELP
100 power supply unit
101 scanning unit
102, 102' data driver
102A input signal processing unit
102B line buffer
102C phase difference control unit
102D table
102E resistance circuit
$102F_1$ to $102F_N$ level shifter
$102G_1$ to $102G_N$ selector unit
$102H_1$ to $102H_N$ output amplifier
$DS_1$ to $DS_N$ control signal
$VGAM_0$ to $VGAM_{17}$ reference voltage
$SL_0$ to $SL_{4095}$ control line
$ND_0$ to $ND_{4095}$ output node
$SW_0$ to $SW_{4095}$ switch element
Ro resistance element
Rp resistance component of wiring
Cp parasitic capacitance of wiring
$Rp_{DTL}$ resistance component of data line
$Cp_{DTL}$ parasitic capacitance of data line
200, 200' smartphone
210, 210' display unit
300 television device
310 display unit

The invention claimed is:

1. A data driver, comprising:
a resistance circuit configured to receive a plurality of reference voltages with different values, wherein
the resistance circuit comprises a plurality of output nodes, and
the plurality of output nodes is configured to:
output the plurality of reference voltages; and
output a plurality of voltages, wherein each voltage of the plurality of voltages is based on division of a respective one of the plurality of reference voltages;
a selector circuit; and
a phase difference control circuit configured to control a delay in an operation of the selector circuit based on a first value of a first input gradation signal of a plurality of input gradation signals, wherein
each input gradation signal of the plurality of input gradation signals corresponds to one of a high tonal range value, a middle tonal range value, or a low tonal range value,
the high tonal range value is greater than the low tonal range value,
the middle tonal range value is greater than the low tonal range value, and lower than the high tonal range value,
the first value of the first input gradation signal is one of the high tonal range value or the low tonal range value, and
the selector circuit is configured to:
select a first output node of the plurality of output nodes based on the delay of the operation of the selector circuit;
control the selected first output node to output a first voltage of the plurality of voltages, wherein the first voltage corresponds to the first value of the first input gradation signal;
select a second output node of the plurality of output nodes without the delay, wherein
the second output node is selected without the delay based on a second value of a second input gradation signal of the plurality of input gradation signals, and
the second value of the second input gradation signal corresponds to the middle tonal range value; and
control the selected second output node to output a second voltage of the plurality of voltages, wherein
the second voltage corresponds to the second value of the second input gradation signal, and
the data driver is configured to drive a display device.

2. The data driver according to claim 1, further comprising:
a storage device configured to store a table containing data associated with a plurality of phase adjustment values, wherein
each of the plurality of phase adjustment values corresponds to a respective one of the plurality of input gradation signals, and
the phase difference control circuit is further configured to control the selector circuit based on the data.

3. The data driver according to claim 1, wherein
the display device includes a plurality of pixels in a two-dimensional matrix,
each of the plurality of pixels includes a plurality of subpixels of different colors, and
the selected first output node is configured to drive at least one subpixel from the plurality of subpixels.

4. The data driver according to claim 3, wherein the at least one subpixel displays a color with highest luminosity.

5. The data driver according to claim 3, wherein the at least one subpixel displays a white color.

6. The data driver according to claim 1, wherein
the phase difference control circuit is further configured to control the delay of the operation of the selector circuit, based on an absolute value that exceeds a reference value, and
the absolute value corresponds to a difference between the first input gradation signal and a preceding input gradation signal of the plurality of input gradation signals.

7. A display device, comprising:
a display circuit that includes a plurality of pixels in a two-dimensional matrix; and
a data driver configured to drive the display circuit, wherein the data driver includes:
a resistance circuit configured to receive a plurality of reference voltages with different values, wherein
the resistance circuit comprises a plurality of output nodes, and the plurality of output nodes is configured to:
   output the plurality of reference voltages; and
   output a plurality of voltages, wherein each voltage of the
   plurality of voltages is based on division of a respective one of the
   plurality of reference voltages;
a selector circuit; and
a phase difference control circuit configured to control a delay in an operation of the selector circuit based on a first value of a first input gradation signal of a plurality of input gradation signals, wherein
each input gradation signal of the plurality of input gradation signals corresponds to one of a high tonal range value, a middle tonal range value, or a low tonal range value,
the high tonal range value is greater than the low tonal range value,
the middle tonal range value is greater than the low tonal range value, and lower than the high tonal range value,
the first value of the first input gradation signal is one of the high tonal range value or the low tonal range value, and
the selector circuit is configured to:
   select a first output node of the plurality of output nodes based on the delay of the operation of the selector circuit;
   control the selected first output node to output a first voltage of the plurality of voltages, wherein the first voltage corresponds to the first value of the first input gradation signal;
   select a second output node of the plurality of output nodes without the delay, wherein
      the second output node is selected without the delay based on a second value of a second input gradation signal of the plurality of input gradation signals, and
      the second value of the second input gradation signal corresponds to the middle tonal range value; and
   control the selected second output node to output a second voltage of the plurality of voltages, wherein the second voltage corresponds to the second value of the second input gradation signal.

8. An electronic apparatus, comprising
a display device that includes:
   a display circuit that includes a plurality of pixels in a two-dimensional matrix, and
   a data driver configured to drive the display circuit, wherein the data driver includes:
   a resistance circuit configured to receive a plurality of reference voltages with different values, wherein
      the resistance circuit comprises a plurality of output nodes, and the plurality of output nodes is configured to:
   output the plurality of reference voltages; and
   output a plurality of voltages, wherein each voltage of the
   plurality of-voltages is based on division of a respective one of the
   plurality of reference voltages;
a selector circuit; and
a phase difference control circuit configured to control a delay in an operation of the selector circuit based on a first value of a first input gradation signal of a plurality of input gradation signals, wherein
each input gradation signal of the plurality of input gradation signals corresponds to one of a high tonal range value, a middle tonal range value, or a low tonal range value,
the high tonal range value is greater than the low tonal range value,
the middle tonal range value is greater than the low tonal range value, and lower than the high tonal range value,
the first value of the first input gradation signal is one of the high tonal range value or the low tonal range value, and
the selector circuit is configured to:
   select a first output node of the plurality of output nodes based on the delay of the operation of the selector circuit;
   control the selected first output node to output a first voltage of the plurality of voltages, wherein the first voltage corresponds to the first value of the first input gradation signal;
   select a second output node of the plurality of output nodes without the delay, wherein
      the second output node is selected without the delay based on a second value of a second input gradation signal of the plurality of input gradation signals, and
      the second value of the second input gradation signal corresponds to the middle tonal range value; and
   control the selected second output node to output a second voltage of the plurality of voltages, wherein the second voltage corresponds to the second value of the second input gradation signal.

9. The data driver according to claim 1, further comprising:
   an output amplifier;
   a switch between the first output node and the output amplifier;
   a resistive component between the switch and the output amplifier; and
   a capacitive component between the switch and the output amplifier.

* * * * *